United States Patent [19]

Weaver et al.

[11] Patent Number: 4,906,324

[45] Date of Patent: Mar. 6, 1990

[54] METHOD FOR THE PREPARATION OF SILICON CARBIDE PLATELETS

[75] Inventors: Samuel C. Weaver; Richard D. Nixdorf, both of Knox County, Tenn.

[73] Assignee: American Matrix, Inc., Knoxville, Tenn.

[21] Appl. No.: 284,911

[22] Filed: Dec. 15, 1988

Related U.S. Application Data

[63] Continuation-in-part of Ser. No. 80,401, Jul. 31, 1987, abandoned.

[51] Int. Cl.$^4$ .................. C30B 23/00; C01B 31/36
[52] U.S. Cl. .................. 156/610; 156/603; 156/DIG. 64; 156/DIG. 68; 423/345
[58] Field of Search ....... 156/603, 605, 610, DIG. 64, 156/DIG. 68; 148/DIG. 148; 423/345; 501/88, 90

[56] References Cited

U.S. PATENT DOCUMENTS

| | | | |
|---|---|---|---|
| 3,011,377 | 12/1961 | Schweickert et al. | 422/199 |
| 3,174,827 | 3/1965 | Wakelyn et al. | 423/346 |
| 3,230,053 | 1/1966 | Wakelyn et al. | 422/199 |
| 3,520,740 | 7/1970 | Addamiano | 156/612 |
| 4,387,080 | 6/1983 | Hatta et al. | 423/345 |

*Primary Examiner*—John Doll
*Assistant Examiner*—R. Bruce Breneman
*Attorney, Agent, or Firm*—Pitts and Brittian

[57] ABSTRACT

A method for producing a high yield of free-flowing alpha-phase single crystal silicon carbide platelets. Through the use of various parameter and composition values, the size range of the platelets can be controlled. For example, small size platelets can be prepared by first heating a mixture of finely divided silicon dioxide and carbon to a temperature of about 1600°±100° C. for a duration of about 5–10 hours to produce a silicon carbide product, referred to as a "prefire" product. This prefire product is mixed with a platelet-enhancing material in the form of powdered carbon or aluminum metal (and mixtures thereof) and then further heated to about 1900°–2400° C. for 2–10 hours to make the platelets. Also, small platelets can be made by substituting silicon carbide whiskers for the intermediate prefire material and adding a platelet enhancing material. Large platelets are formed by mixing the prefire product and a platelet-enhancing material of a mixture of powdered aluminum metal and anhydrous boric oxide. This mixture is heated to about 2150°±250° C. for 2–10 hours. During any of the heating steps the gaseous products of the reaction are maintained at substantially steady state by flowing an inert gas, e.g., argon, through the furnace.

15 Claims, No Drawings

METHOD FOR THE PREPARATION OF SILICON CARBIDE PLATELETS

This is a continuation-in-part patent application based upon parent patent application Ser. No. 80,401, filed July 31, 1987, now abandoned.

TECHNICAL FIELD

This invention relates generally to the preparation of ceramic material useful, for example, in the strengthening of certain composite materials and increasing the hardness and abrasion resistance of others, and more particularly to an economical and high yield process for the preparation of silicon carbide platelets for such use.

BACKGROUND OF THE INVENTION

In recent years there has been increasing interest in the manufacture of composite materials utilizing ceramic whiskers, fibers or platelets as the material for reinforcing metallic, polymeric or ceramic matrix materials. This not only strengthens most metallic and polymeric matrix materials, but also provides an attractive toughening mechanism for ceramics. For example, platelets substantially increase the hardness and abrasion resistance of aluminum alloys. Important criteria used for choosing the optimum material in a particular application are the ratio of strength to weight, and the ratio of modulus of elasticity to weight.

Silicon carbide in the form of whiskers and platelets have been the primary materials now under consideration for such use in composite materials. Silicon carbide is used as it has excellent mechanical properties, good thermal conductivity, good oxidation resistance and is a semi-conductor with superior properties. In most applications silicon carbide in the form of whiskers (single crystal discontinuous fibers) have been used. However, there are some problems encountered with the use of whiskers:

(a) it is difficult to obtain a uniform dispersion in the matrix materials because the whiskers tend to agglomerate and are difficult to disperse—they also have a tendency to reagglomerte.

(b) manufacturing costs, and thus selling prices, are high.

(c) whisker materials are relatively impure which causes compatibility problems with the matrix material being reinforced.

In contrast, the use of silicon carbide platelets solves many of the problems inherent with the use of silicon carbide whiskers. The platelets can be made to be very free flowing so that mixing of the platelets into a host matrix is relatively easy. Also, higher "loadings" with the platelets can be achieved and the platelets exhibit enhanced wetting when incorporated into metallic materials. Silicon carbide platelets can be made to a very high level of purity: almost 1000 times more pure than silicon carbide whiskers. The main problem, however, is the cost of their manufacture.

The term "platelets", as used herein, is to be understood to apply to crystalline structures having an average thickness from about 0.5 microns to about 150 microns, and a diameter from about 3 to about 100 times larger than the thickness. The smaller diameter of these materials are sometimes referred to as "flakes" which often are obtained as a by-product of the production of silicon carbide powders, for example. It is these flakes that are most commonly used. The platelet crystal can consist of metals, metal carbides, metal borides, metal nitrides, metal oxides, etc.

As stated above, one of the most widely used and researched of the whisker and platelet materials is silicon carbide. Because of its importance, numerous processes have been developed for the production of these silicon carbide materials. For the production of silicon platelets, for example, a process is described in U.S. Pat. No. 3,520,740 issued to A. Addamiano on July 14, 1970. In this patent the product is produced by reacting a mixture of $SiH_4$, $C_3H_8$, and $H_2$ in a bell jar. In another patented process described in U.S. Pat. No. 3,011,877 issued to H. Schwieckert, et al., hydrogen is reacted with silicon tetrachloride or silica-chloroform on a heated strip, such as tantalum. These are but a sample of the many patents related to the production of silicon carbide platelets.

Other patents in the general technology are: U.S. Pat. No. 4,387,080 issued to Hatta, et al., on June 7, 1983; and U.S. Pat. Nos. 3,174,827 and 3,230,053 issued to N. T. Wakelyn, et al.

One of the problems encountered with the processes of the patents for production of silicon carbide platelets and whiskers is the low yield. Most of the described processes require plating onto some type of substrate material which involves subsequent removal. This removal step is slow, tedious, and thus expensive. Another problem is that these processes are low volume production processes. Also, some of the processes require expensive and hazardous starting materials. Furthermore, several of the processes produce a product that only slightly resembles a platelet: the opposite faces are only generally parallel.

Accordingly, it is a primary object of the present invention to develop an economical process for the preparation of silicon carbide platelets.

It is another object of the invention to develop a process for the preparation of silicon carbide platelets that has high yield and can be performed in production-sized apparatus.

It is also an object of the present invention to provide a process that does not require a substrate for the formation of the product, and a process that does not use hazardous materials.

It is a further object to provide a process for the preparation of silicon carbide platelets having substantially parallel and flat opposite surfaces.

A further object of the present invention is to provide a process whereby silicon carbide platelets can be produced in selected ranges of sizes.

Still another object is to provide a process whereby the platelets are singular, as contrasted to complex platelets, so as to eliminate loss of material that occurs when complex platelets are mechanically converted to single platelets.

These and other objects of the present invention will become apparent upon a consideration of the full description of the invention given hereinafter.

SUMMARY OF THE INVENTION

In accordance with the present invention, silicon carbide platelets are prepared in a process involving, preferably, two heating steps. In the first step, an intimate mixture of finely divided graphite powder and finely divided silicon dioxide powder is prefired to about $1600° \pm 100°$ C. for a period of from about 5 to 10 hours. In this mixture the silicon dioxide to carbon weight ratio is about 2:1, with a ratio of 2.15:1 being preferred. This produces an intermediate "prefire" SiC material. If desired, silicon carbide whiskers can be substituted for the prefire material. This initial material is then fired at a temperature of about 1900° to about 2400° C., with an optimum temperature being about 2150° to 2250° C. Preferably, additional carbon is added before this final heating step. The gaseous products of the reaction are maintained at a steady state as with a flow of inert gas (e.g., argon) through the furnace. Preferably, the silicon dioxide particles are of minus 60 mesh in size, and the graphite powder is about 40 micrometers or smaller. The production of the silicon carbide platelets is enhanced using one or more reaction catalysts preferably added before the final heating.

BEST MODE FOR CARRYING OUT THE INVENTION

A method for producing a high yield of satisfactory alpha silicon carbide platelets has been developed using as the starting materials, very small particles of silicon dioxide ($SiO_2$) and very small graphite particles. For example, the silicon dioxide powder should have a particle size (average diameter) of about minus 60 mesh, and the graphite powder should be about 40 micrometers or smaller. These starting materials should be uniformly mixed, and can have a relatively high packing density (in excess of 1.0 gm/cm$^3$ causes the reaction to be slower or less complete).

An especially useful silicon dioxide starting material for achieving a satisfactory packing density and very pure product is fused silica as manufactured by LECO of Lawrenceville, Ga. This material is available in a size of minus 60 mesh. A suitable graphite powder is A99 graphite powder as manufactured by the Asbury Co. of Asbury, N.J. This also has a size of about minus 60 mesh or about 40 micrometers or smaller. The A99 powder is not very high purity material, but the resulting packing density is very close to optimum which is close to 1 gm/cm$^3$. Further, the process provides for natural purification such that the resulting product typically has less than 0.1% by weight total impurities. While these starting products produce a satisfactory product, other starting materials having the same characteristics produce a high yield of suitable alpha silicon carbide platelets. For example, an alternate graphite starting material can be prepared by carbonizing alpha cellulose in an inert atmosphere in a temperature range of about 400 to about 3000° C. A temperature of about 900° C. is typical.

The composition of a starting mixture was investigated to determine a range of compositions as well as an optimum composition for that mixture. The starting materials were added with the weight ratio of the silicon dioxide to graphite being about 1.75:1 to about 2.75:1. While reasonably satisfactory platelets were obtained with a weight ratio of about 2.0:1 to about 2.25:1, the most satisfactory product was obtained at a weight ratio of 2.15:1 of the $SiO_2$ to graphite. This composition did not utilize a catalyst (which permits using a reduced packing density) so as to accelerate the reaction rate.

A two-step firing of the mixture was found to produce a generally superior product. Accordingly, the intimate mixture of $SiO_2$ and graphite powders was first heated to a temperature of about 1600°±100° C. for about 5 to about 10 hours to initially form an intermediate SiC material (referred to herein as "prefire" material), and then heated to about 1900° to about 2200° C. for about 2 to about 10 hours to produce the useful alpha silicon carbide platelet product. Temperatures as high as 2400° C. can be used. During the heating, the gaseous products of the reaction at the surface of the mixture should be maintained at steady state. This is accomplished by flowing a generally inert gas through the furnace. Typically, this gas can be argon, helium or carbon monoxide: argon being preferred. For the final firing, a temperature of about 2100°±100° C. is preferred. The size and thickness of the platelets can be generally adjusted through a selection of the temperature and time within these satisfactory ranges. For example, larger diameter high purity single crystal platelets can be manufactured by heating a mixture of the preferred starting mixture to a final temperature of 2200° C., and holding the temperature for about 8 hours. However, this size control is not as accurate as desired when the final product is to have a specific range of sizes.

As stated above, a mixture having a lower packing density can be used if a catalyst is added to the mixture. One such catalyst is boron oxide; typically, this can be anhydrous boric oxide, $B_2O_3$. Other decomposable compounds of boron, as well as those of aluminum and lanthanum, can be used. For example, 0.01 to 10 parts by weight of a catalyst can be effective for carrying out the process of producing alpha silicon carbide platelets. Tests demonstrated that when anhydrous boron oxide was utilized, a range of 0.1 to 0.9 parts by weight (based upon the combined weights of $SiO_2$ and carbon) can effectively accelerate the reaction of the starting materials such that a higher void volume (a lower packing density) can be used. A preferred range of concentration of $B_2O_3$ is about 0.1 to 0.5 parts by weight. For use with a catalyst, the ratio of the other starting materials can be about 2:1 $SiO_2$ to graphite, although a range of about 2 to about 2.25 is satisfactory.

Additional study has shown that while the above-described process (and its variations) produce satisfactory silicon carbide platelets, these platelets have a wide range of sizes: about 1.5 to 15,000 microns in diameter. Many applications for platelets require sizes within smaller ranges. These can be separated from the product platelets with a separate step; however, this adds to the cost of their production. Also, the platelets are often "complex" in that many are joined so that they cannot be considered single platelets. These complex platelets must be physically broken into single platelets for use as strengthening agents in a matrix.

It has been found that platelets in the limited range of 0.5 to 5$\mu$ in thickness and 5–75$\mu$ in diameter can be produced by minor modifications to the above-described process. One of these modifications involves mixing additional carbon to the prefire (product of heating $SiO_2$ and C at 1600°100° C.). As little as 1 wt% graphite powder added after prefiring (but before final heating) reduces the size of the platelets significantly. Although the graphite can be derived from hammer-milled coal, phenolic resin, carbon black, carbonized cellulose and carbonized cotton, the aforementioned A99 graphite (Asbury Co.) is especially effective. The size of the platelets decreased as the carbon content (Asbury A99) was increased up to 12 parts of A99 for each 100 parts of prefire. The optimum was found to be about 10.5 parts of A99 per 100 parts of prefire.

Increased uniformity of form of the platelets is enhanced by adding about 0.05 to about 2.0 parts of aluminum metal powder to the prefire material before final heating, with about 0.5 parts being optimum. This aluminum metal powder apparently acts as a catalyst in the formation of the platelets. A significantly smaller amount of complex platelets results from the use of this catalyst.

The final firing step is achieved by placing the mixture in a graphite boat in a furnace, and heating to 2100°±100° C. for about 2 to 10 hours. Typically about 3000 g of the mixed prefire, carbon and catalyst are placed in the furnace boat. This is a loading of about 0.3–0.4 g/cm$^3$. As stated above, the gaseous products of the reaction are maintained at steady state by flowing an inert gas (e.g., argon) through the furnace. The flow rate is typically 40 cfh. This loading typically results in about 1200 g of product.

Valuable product platelets can also be produced by substituting previously-prepared silicon carbide whiskers (as produced with the process of copending patent application Ser. No. 23,673 filed Mar. 9, 1987, now abandoned) for the prefire material described above. These SiC whiskers are mixed with carbon as above (e.g., carbon black or other carbon sources) and then fired at up to about 2200°±25° C. No catalyst (e.g., aluminum) is required to produce fully formed silicon carbide platelets of the above-identified small size. As in the case of the small platelets via producing a prefire material, firing is accomplished in graphite furnace boats at a loading of 0.3–0.4 g/cm$^3$. An argon sweep gas maintains the gaseous products of the reaction at equilibrium. Since either the prefire material or the silicon carbide whiskers can be used, these are referred to as "silicon carbide preproduct material".

For use in polymeric applications, as well as for electronic applications, very large platelets are desired. A modification of the present process has been developed that will produce a predominance of platelets of 1–25μ thickness and 500–15,000μ in diameter. This modification involves the addition (to the prefire material) of powdered aluminum metal to the anhydrous boric oxide catalyst prior to the final firing step at 2200±25° C. Specifically, a preferred mixture of about 100 parts of prefire material is mixed with about one part of aluminum metal powder and about 1.2 parts of anhydrous boric oxide. This is placed into the graphite furnace boat at a loading of about 0.05 g/cm$^3$. This lower loading, as contrasted to the 0.3–0.4 g/cm$^3$, results in the desired large silicon carbide platelets.

From the foregoing, it will be understood by those versed in the art that a method has been described for producing a high yield of alpha silicon carbide platelets. Variations in the method can be selected to achieve platelets in different size ranges. In general, this is accomplished through the choice of a rather narrow range of compositions of a mixture of very fine particles of silicon dioxide and graphite and a two-step heating firing. Furthermore, the process is benefited by the presence of a catalyst. Alternatively, silicon carbide whiskers can be substituted for the need of the preliminary "prefire" step. The gaseous products of the reaction formed during the heating generally must be maintained at steady state throughout the heating cycles so that the desired reactions to form the platelets are not inhibited. The resultant platelets are free-flowing and are of a quality and purity useful in the reinforcing of many matrix materials.

Although only specific materials and conditions are discussed herein, the invention is not to be limited to those materials or conditions. Rather, the invention is to be limited only by the appended claims and their equivalents.

We claim:

1. A method for producing free-flowing single crystal alpha-phase silicon carbide platelets, which comprises the steps:
   preparing a mixture of
   a. a silicon carbide preproduct material selected from the group consisting of silicon carbide whiskers and a silicon carbide prefire material produced from heating silicon dioxide powder and carbon particles at a first temperature of about 1600°±100° C. for about 5 to 10 hours, and
   b. a finely divided platelet-enhancing material selected from the group consisting of a carbon source, aluminum metal, anhydrous boric oxide and mixtures thereof in a proportion of about 100 parts of silicon carbide product and about 0.5 to about 12 parts of platelet-enhancing material;
   heating said mixture of silicon carbide preproduct material and platelet-enhancing material at a second temperature of about 1900°–2400° C. in a furnace for a duration of about 2-10 hours; and
   maintaining gaseous products of the reaction during at least said heating at said second temperature at substantially steady state by flowing a substantially inert gas through said furnace at a selected rate.

2. The method of claim 1 wherein said silicon carbide material is silicon carbide whiskers and said platelet-enhancing material is carbon black, wherein said second temperature is about 2200°±25° C., and said heating time is about 8–10 hours.

3. The method of claim 1 wherein said inert gas is argon.

4. The method of claim 1 wherein said silicon carbide preproduct material is a silicon carbide prefire material produced by heating silicon dioxide powder and carbon particles at said temperature of about 1600°±100° C. for about 5–10 hours.

5. The method of claim 4 wherein said platelet-enhancing material is finely divided graphitic carbon powder.

6. The method of claim 4 wherein said platelet-enhancing material is a mixture of powdered aluminum metal and anhydrous boric oxide, with said anhydrous boric oxide being about 1.2 parts and said aluminum metal being about 1 part, based upon 100 parts of said silicon carbide prefire material.

7. A method of producing free-flowing single crystal silicon carbide platelets, which comprises the steps:
   preparing a mixture of silicon dioxide particles and carbon particles, said silicon dioxide particles having an average diameter of no greater than about minus 60 mesh and said carbon particles having an average diameter no greater than about 40 micrometers, said mixture having a weight ratio of SiO$_2$ to carbon of about 1.75:1 to about 2.75:1 and a packing density less than about 1.0 g/cm$^3$;
   heating said mixture to a first temperature of about 1600°±100° C. in a furnace for a time duration of about 5 to about 10 hours to produce a silicon carbide prefire material, followed by cooling to room temperature;
   mixing said prefire material with up to about 12 parts of a finely divided platelet-enhancing material selected from the group consisting of a fine carbon source, powdered aluminum metal, anhydrous boric oxide and mixtures thereof;

heating said mixture of prefine material and platelet-enhancing material to a second temperature of about 1900 to about 2400° C. in a furnace for about 2 to about 10 hours to produce said silicon carbide platelets; and maintaining gaseous products of the reaction during said heating at said first and second temperatures at a substantially steady state by flowing a substantially inert gas through said furnace at a selected rate.

8. The method of claim 7 wherein said platelet enhancing material is graphitic carbon added at about 1-12 parts based upon 100 parts of said prefire material, wherein said mixture of prefire material and said carbon is loaded within a furnace boat at a loading of about 0.3 to about 0.4 g/cm$^3$, and said second temperature is 2150°±250° C.

9. The method of claim 8 wherein said carbon is about 10.5 parts based upon said prefire material.

10. The method of claim 7 wherein said platelet-enhancing material is a mixture of powdered graphitic carbon and powdered aluminum metal, said graphitic carbon and aluminum metal being present at about 1-12 parts and about 0.05 to 2 parts, respectively, based upon 100 parts of said prefire material.

11. The method of claim 10 wherein said graphitic carbon is about 10.5 parts base upon said prefire material.

12. The method of claim 7, wherein said platelet-enhancing material is a mixture of powdered aluminum metal and powdered anhydrous boric oxide in a proportion of about 1 part powdered aluminum metal and 1.2 parts anhydrous boric oxide, based upon 100 parts prefired material, and wherein said mixture of said prefire material and said platelet-enhancing material is loaded within a furnace boat at a loading of about 0.05 g/cm$^3$, and said second temperature is 2150°±250° C.

13. The method of claim 7 wherein said inert gas is argon.

14. A method of producing free-flowing single crystal alpha phase silicon carbide platelets having a thickness of about 0.5 to about 5 microns and a diameter of about 5 to about 75 microns, which comprises the steps:

preparing a mixture of silicon dioxide particles and carbon particles, said silicon dioxide particles having an average diameter of no greater than minus 40 mesh and said carbon particles having an average diameter no greater than about 40 micrometers, said mixture having a weight ratio of $Si_2O$ to carbon of about 1.75:1 to about 2.75:1 and a packing density less than about 1.0 g/cm$^3$;

heating said mixture of silicon dioxide and carbon particles to a first temperature of about 1600°±100° C. in a furnace for a time duration of about 5 to about 10 hours to produce a silicon carbide prefire material;

mixing said prefire material with about 8-12 parts of finely divided graphite powder, based upon 100 parts of said prefire material;

heating said mixture of prefire material and graphite powder to a second temperature of about 2150°±250° C. in a furnace for about 2-10 hours at a loading of about 0.3-0.4 g/cm$^3$; and maintaining gaseous products of the reaction during said heating at said first and second temperatures at a substantially steady state by flowing argon gas through said furnace at a selected rate.

15. A method of producing free-flowing single crystal alpha-phase silicon carbide platelets having a thickness of about 0.5 to about 5 microns and a diameter of about 5 to about 75 microns, which comprises the steps:

preparing a mixture of silicon carbide whiskers and carbon black in a ratio of about 100 parts silicon carbide whiskers and about 1-12 parts carbon black;

heating said mixture of silicon carbide whiskers and carbon black in a furnace at about 2150°±250° C. for about 8-10 hours; and maintaining gaseous products of the reaction during said heating at a substantially steady state by flowing argon gas through said furnace at a selected rate.

* * * * *